United States Patent [19]

Yamaoka et al.

[11] Patent Number: 4,672,402

[45] Date of Patent: Jun. 9, 1987

[54] SEMICONDUCTOR CIRCUIT DEVICE INCLUDING AN OVERVOLTAGE PROTECTION ELEMENT

[75] Inventors: Masami Yamaoka, Anjo; Yukio Tsuzuki, Aichi; Shoji Toyoshima, Konan, all of Japan

[73] Assignee: Nippondenso Co., Ltd., Kariya, Japan

[21] Appl. No.: 912,673

[22] Filed: Sep. 25, 1986

Related U.S. Application Data

[63] Continuation of Ser. No. 594,016, Mar. 24, 1984, abandoned.

[30] Foreign Application Priority Data

Mar. 31, 1983 [JP] Japan ................................. 58-56198

[51] Int. Cl.$^4$ ............................................. H01L 29/90
[52] U.S. Cl. ...................................... 357/13; 357/46; 357/34; 357/35; 357/51
[58] Field of Search .................. 357/13, 42, 41, 34, 357/35, 51, 52, 46, 13 U, 13 Z, 13 LM, 23.1, 23.4, 23.8, 23.16, 23.13, 23.14

[56] References Cited

U.S. PATENT DOCUMENTS

| 3,673,428 | 6/1972 | Athanas | 357/42 X |
| 3,999,212 | 12/1976 | Usuda | 357/41 |
| 4,072,975 | 2/1978 | Ishitani | 357/23.13 |
| 4,131,908 | 12/1978 | Daub et al. | 357/42 |
| 4,236,164 | 11/1980 | Tang et al. | 357/34 X |
| 4,320,409 | 3/1982 | Shoji | 357/52 X |
| 4,377,029 | 3/1983 | Ozawa | 357/34 X |
| 4,423,431 | 12/1983 | Sasaki | 357/41 |
| 4,509,067 | 4/1985 | Minami et al. | 357/13 |

FOREIGN PATENT DOCUMENTS 57-45975 3/1982 Japan ............................. 357/23.13

OTHER PUBLICATIONS

*Electronics*, p. 42, Apr. 26, 1971.

*Primary Examiner*—Andrew J. James
*Assistant Examiner*—William A. Mintel
*Attorney, Agent, or Firm*—Cushman, Darby & Cushman

[57] ABSTRACT

In a semiconductor circuit device having a diode as an overvoltage protection element, a semiconductor substrate is comprised of an N-type collector substrate integral with a transistor. An N+ type collector diffusion layer is formed on the rear surface of the substrate. A P-type anode region and a N+ cathode region are formed in the major surface of the substrate so that they are spaced apart from each other and the N+ cathode region has the same type of impurity, but at a higher impurity concentration level than, the semiconductor substrate. An insulating film is formed on the surface of the resultant structure. A gate electrode is formed in an overlapping relation to the anode region and cathode region with an insulating film therebetween. A gate potential is established between the gate electrode and the underlying substrate.

3 Claims, 11 Drawing Figures

SEMICONDUCTOR CIRCUIT DEVICE INCLUDING AN OVERVOLTAGE PROTECTION ELEMENT

This is a continuation of application Ser. No. 594,016, filed Mar. 24, 1984, which was abandoned upon the filing hereof.

BACKGROUND OF THE INVENTION

This invention relates to a semiconductor circuit device including a diode arrangement as an overvoltage protection element, which is formed integrally with a power transistor for switching an inductance load such as an igniter for use in an engine ignition circuit, and sets a stable breakdown voltage to protect the transistor.

An IC semiconductor device includes a protection diode as one kind of an overvoltage protection element. The diode can be variously designed to lower the breakdown voltage $V_Z$ in comparison with the emitter-to-collector voltage $V_{CEO}$ of a transistor which is protected when the base of the transistor is open. For example, a portion of an inactive base region in the semiconductor substrate is deeply formed as a diffusion layer, and thus the breakdown voltage $V_Z$ is established by a reach-through into the high concentration collector region. The breakdown voltage $V_Z$ can also be created by implanting ions into a portion of an inactive base region to form a high concentration region having the same conductivity as that of the collector under high precision control. Such a semiconductor circuit device includes an active region therein, and thus a variation in the breakdown voltage $V_Z$ presents no problem. However, an extra manufacturing step is required to form a protection diode. Thus, a complicated manufacturing step is required in the fabrication of such a semiconductor circuit device. Now suppose that such a semiconductor circuit device is used for controlling an ignition coil mounted, for example, on an ignition control device of an internal conversion engine. It is, therefore, very difficult to set the breakdown voltage of 360 V±10% necessary for controlling the ignition signal. The result is an expensive product which has a low yield.

SUMMARY OF THE INVENTION

A primary object of this invention is to provide a semiconductor circuit device including an overvoltage protection element, such as a diode, which can be fabricated in the simple manufacturing steps of an ordinary transistor, etc.

Another object of this invention is to provide a semiconductor circuit device which sufficiently stabilizes the breakdown voltage of the overvoltage protection element and provides better controllability of the breakdown voltage characteristics.

The semiconductor circuit device of this invention includes: a semiconductor substrate; a first region formed in the major surface of the semiconductor substrate, having a conductivity opposite to that of the semiconductor substrate; a second region formed in the major surface of the semiconductor substrate which is spaced apart from the first region, and has the same conductivity type as, and a higher impurity concentration than, the semiconductor substrate; and a conductive film as a gate electrode formed in at least an overlapping relation to the first and second regions with an insulating layer therebetween.

Another object of this invention is to provide a lateral diode which can control the gate potential at an overlap area between the anode and the cathode when the gate is floated, and which suppresses the carrier injection during an avalanche to maintain a highly stable state even when a breakdown occurs.

DETAILED DESCRIPTION OF THE PREFERRED EMBODIMENTS

Figure 1:
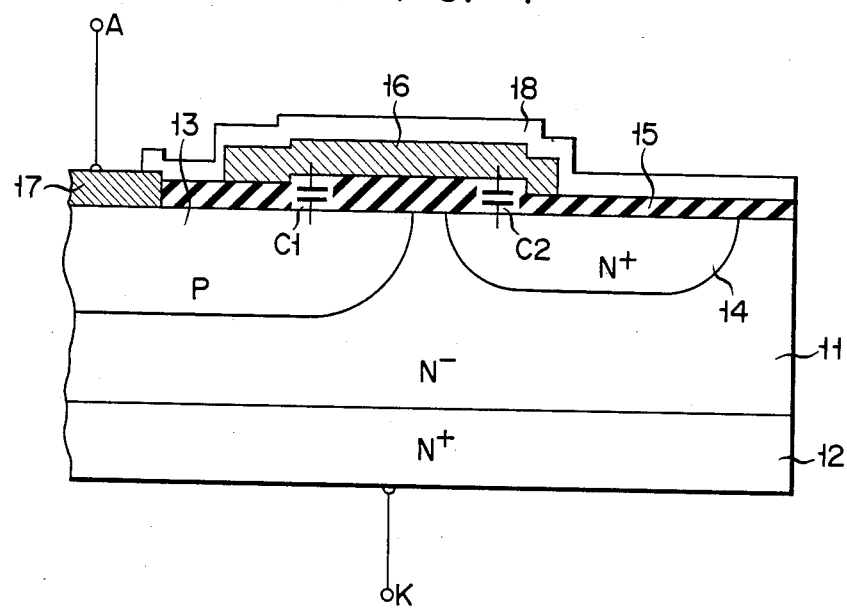
FIG. 1 shows a view for explaining the cross-section of a semiconductor circuit device including an overvoltage protection element which is made according to a first embodiment of this invention.

FIG. 1 shows a cross section of a diode section which serves as a breakdown element. A semiconductor substrate 11 is constructed as an N-type collector substrate for forming, for example, a transistor. An epitaxial substrate or an N+ type collector diffusion layer 12 is formed adjacent to the rear surface of the semiconductor substrate 11.

In the major surface portion of the semiconductor substrate 11 a P-type anode region 13 is formed as a first region and an N+ cathode region 14 of a high impurity concentration, which is of the same type as that of the substrate 11, is formed as a second region spaced apart from the anode region. An insulating film 15, such as SiO$_2$, is formed on the major surface portion including the first region 13 and second region 14. A gate electrode 16, formed of a conductive film, is formed on the surface of the insulating film 15 such that it is in an overlapping relation to both the anode region 13 and cathode region 16. An anode electrode 17 is formed for the P-type anode region 13, and an anode A is electrically connected to the electrode 17. The surface portion of the resultant structure is protectively covered with a protection film 18, such as a nitride film.

Figure 2:
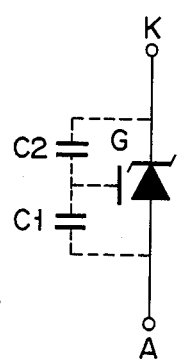
FIG. 2 shows an equivalent circuit for explaining a protection diode section of the semiconductor circuit device as shown in FIG. 1.

In the semiconductor circuit arrangement so obtained, a capacitance C1 is formed between the p-type anode region 13 and the gate electrode 16, and a capacitance C2 is formed between the N+ type cathode region 14 and the gate region 16. A diode as shown in FIG. 2 is also formed there. That is, the gate electrode 16 is set to correspond to a potential on a junction between the capacitances C1 and C2. The diode so obtained acts as an overvoltage protection element and is incorporated into a semiconductor circuit device for controlling, for example, the ignition coil of an engine.

Figure 3:
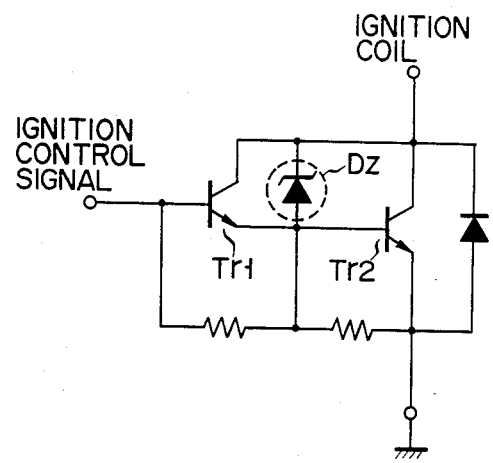
FIG. 3 is a circuit diagram showing one form of a Darlington transistor circuit including the divide shown in FIG. 2.

FIG. 3 shows one form of Darlington transistor circuit including a protection diode which supplies an ignition signal to the ignition coil of the engine. The transistor circuit is comprised of a drive stage transistor Tr1 and an output stage transistor Tr2 connected in a Darlington configuration. An overvoltage protection diode Dz is connected between the collector and the base of the transistor Tr2.

Figure 4A:
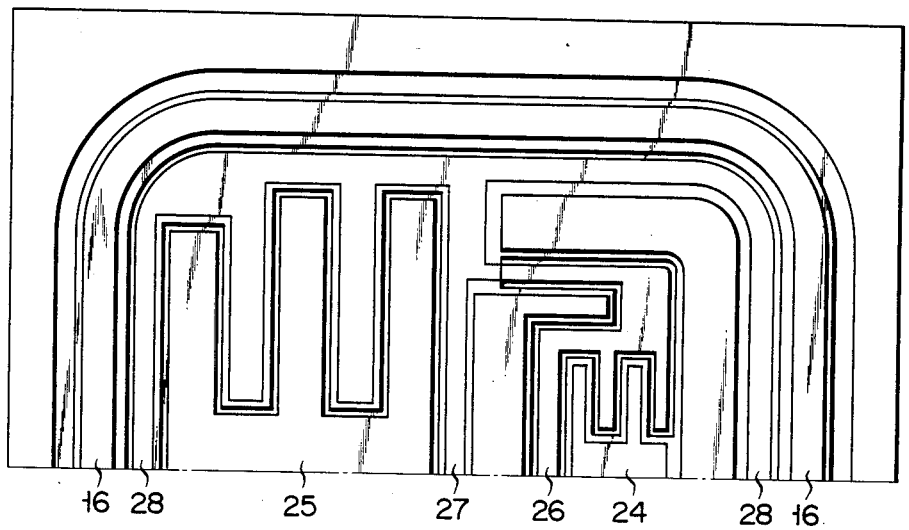
FIG. 4A is a plan view schematically explaining an arrangement of a semiconductor circuit device implementing the transistor circuit as shown in FIG. 3.
Figure 4B:
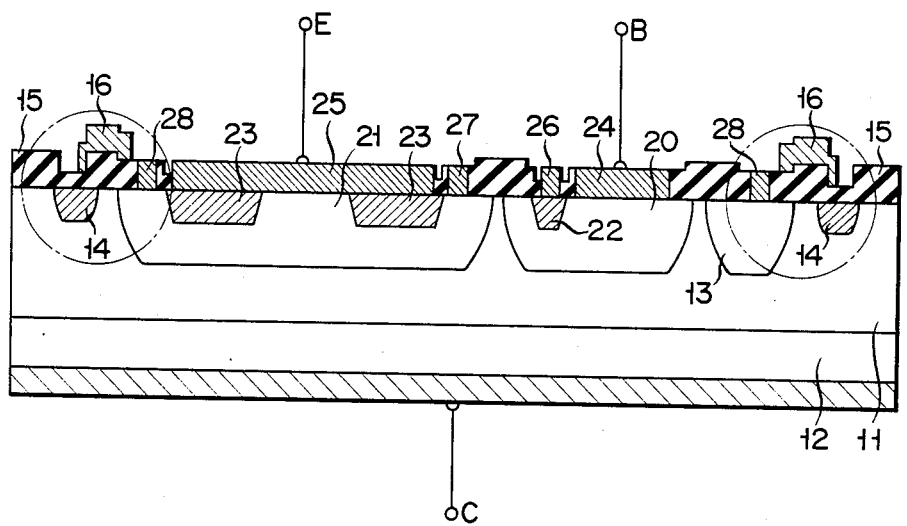
FIG. 4B is a view for explaining the cross-sectional arrangement of the semiconductor circuit device as shown in FIG. 4A.

FIGS. 4A and 4B show an arrangement of a semiconductor circuit device which is comprised of a monolithic protection diode-incorporated NPN Darlington power transistor and thus is an ignition control circuit for an engine which includes a protection diode circuit. An N+ type collector diffusion layer 12 is formed adjacent to the rear surface of an N-type semiconductor substrate 11. A drive stage base region 20 of p-type and an output stage base region 21 of p-type are formed in the major surface portion of the semiconductor substrate 11. A p-type anode region 13 of a diode is formed such that it surrounds the regions 20 and 21. A drive stage N+ type emitter region 22 and N+ type output stage region 23 are formed in the base regions 20 and 21, respectively. A drive stage base electrode 24 and drive stage emitter electrode 26 are formed for the region 20, and an output stage base electrode 27 and output stage emitter electrode 25 are formed for the region 21. In this case, the base electrode 27 is formed such that it is also shared as the anode electrode 28 as indicated by the circled portions in FIG. 4B. A collector electrode 29 is formed on the surface of the collector region 12.

An N+ type cathode region 14 is separately formed from the region 13 such that it surrounds the p-type anode region 13. An insulating film 15 is formed on the surface of the anode region 13 and cathode region 14. A gate electrode 16 is formed in an overlapped relation to the anode region 13 and cathode region 14. In this embodiment, the anode region 13 of the diode is formed such that it is spaced apart from the base region 20 of the drive stage transistor. In this case, however, the base region 21 of the output stage transistor is also shared as the anode region 13.

Figure 5:
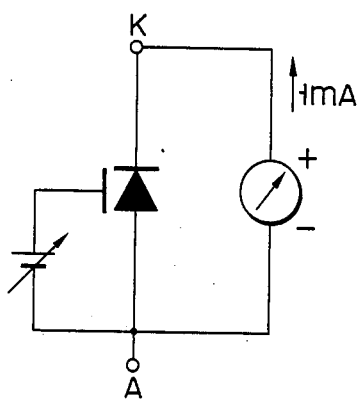
FIG. 5 is a circuit for measuring the characteristic of the protection diode section of the semiconductor circuit device as shown in FIGS. 4A and 4B.

FIG. 5 shows a circuit for measuring the breakdown characteristic of the overvoltage protection diode as used in the semiconductor circuit device which constitutes the ignition control circuit as mentioned above. This circuit continuously supplies a constant current to the diode to continually monitor the breakdown voltage. The circuit controls the gate voltage, causing the variation in the electric field strength of the insulating film underlying the gate, as well as a variation in the initial value of the breakdown voltage.

Figure 6:
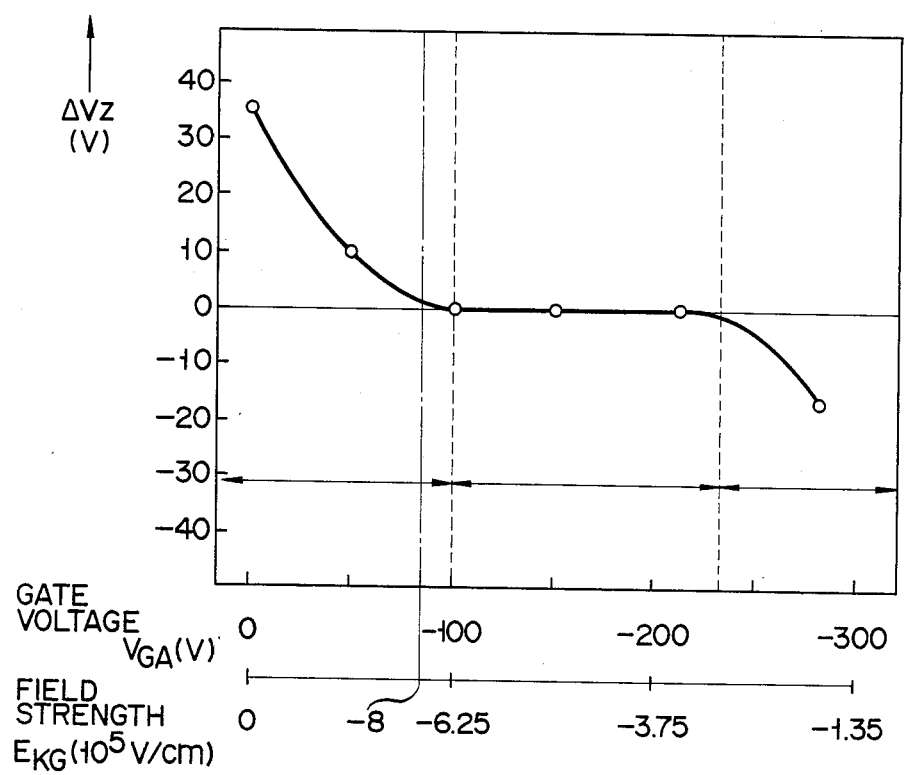
FIG. 6 is a view showing the breakdown voltage characteristic of the protection diode measured by the measuring circuit as shown in FIG. 5.

With a constant breakdown voltage of 1 mA at an ordinary temperature, the relation of the gate potential to the variation $\Delta V_Z$ of the breakdown voltage $V_Z$ after a lapse of 1000 hours (H) is measured using the above-mentioned measuring circuit. The result of this measurement is as shown in FIG. 6.

In the diode of the semiconductor circuit device as shown in FIG. 1, voltage $V_{KG}$ between the gate electrode 16 and the substrate 11 underlying the gate electrode 16 with respect to the reverse bias voltage $V_{KA}$ applied across the diode will be given as below:

$$V_{KG} = \{C1/(C1+C2) \times V_{KA}\}$$

When the reverse bias voltage $V_{KA}$ becomes negative, the voltage $V_{KG}$ varies in the same direction.

When the insulating film 15 between the gate electrode 16 and the substrate 11 is a 4 $\mu$ thick SiO$_2$ film with the surface concentration of the substrate 11 and electric charge density of the surface portion of the surface 11 representing $1 \times 10^{14}$ atms/cm$^3$ and Qss = $1 \times 10^{11}$ c/cm$^2$, respectively, the voltage $V_{KG}$ is of the order of $-30$ to $-50$ V, and a p-type inversion layer is formed on the surface of the substrate 11, reaching the high concentration region of the cathode. A depletion layer is expanded mainly into the N-type region of the substrate 11 along the p-type inversion layer and PN junction between the anode region 13 and the substrate 11. When the voltage further varies in the same direction, the depletion layer is expanded, while permitting the p-type inversion layer to be driven out at the surface of the substrate 11 underlying the gate electrode 16. As a result, an avalanche breakdown occurs there. It is known that at such a time hot electrons are injected and trapped in the insulating film 15 underlying the gate electrode 16 and thus a variation in the breakdown voltage occurs. It is to be noted that, with the gate voltage $V_{KG}$ set to be negative, the injection of the hot electrons can be prevented under the presence of a negative electric field. However, such a negative electric field facilitates the injection of the hot holes.

Holes involve a greater barrier against the oxide film than electrons and have a short mean free path. The injection probability is known to be of the order of about $10^{-3}$.

It has been found that, as shown in FIG. 6, when a continuous breakdown occurs after 100 hours at the breakdown current of 1 mA, with $V_{GA}=0$ in the circuit of FIG. 5 and with $V_{KG}$ as a negative voltage, a greater variation in the breakdown voltage is manifested which is of the order of a few $+V$. When a further variation of $V_{GA}$ results in a decrease in the negative potential ($V_{KG}$), a smaller variation in the breakdown voltage due to the injection of the holes occurs and an almost zero region emerges. With a further decrease in the negative potential, the injection of the electrons is barely suppressed and again a variation in the breakdown voltage occurs.

Here, when the holes are injected into the N-type substrate, the surface concentration is increased and the voltage $V_T$, at which the p-type inversion layer occurs, is increased. As a result, the breakdown voltage is also increased. It is believed that when, on the other hand, electrons are injected, the voltage $V_T$ is decreased and thus the breakdown voltage is lowered.

The results of the experiments conducted reveal that, in order to prevent the injection of the holes and electrons and stabilize the breakdown voltage, $V_{GA}$ may be set to $-50$ V to $-250$ V and, in the case of $V_{KG}$, a gate voltage may be set so as to obtain an electric field intensity of about $[-8 \sim -2 \times 10^5 \text{ V/cm}]$.

In the semiconductor circuit device shown in FIG. 1, through the proper control of an overlap area between the anode region 13 and cathode region and the gate electrode 16, the capacitances C1 and C2 can be set so as to obtain a potential given by:

$$V_{KG} = V_{KA} \times \{C1/(C1+C2)\}$$

In this case, a large value capacitor (C1+C2) charges due to surging etc., prevents a possible erroneous operation. However, the above-mentioned overlap area is increased, resulting in an increased chip size. In practice, it is desirable that the capacitance, C1+C2, range from several pF. to tens of PF.

Thus, a means for providing a gate potential through a capacitance corresponding to the overlap area, which can readily be set during the fabrication of a semiconductor device, can be manufactured in the same manufacturing step as in the manufacturing step of an ordinary transistor.

The Darlington transistor circuit of FIG. 4, which is shown as the equivalent circuit in FIG. 3, has the same substrate concentration and insulating film thickness as those of FIG. 1 and includes the anode region 13 formed simultaneously with the formation of the base regions 20 and 21 in the diffusion step which has a depth of 30 $\mu$m and with the cathode region (high concentration region) 14 formed simultaneously with the formation of the emitter regions 22 and 23 in the diffusion step which has a depth of 20 $\mu$m. In this embodiment, the chip size is 5 square millimeters, the anode-to-cathode breakdown voltage is $BV_{AK}=350$ V at C1+C2=20 PF and C1=10 PF. Upon calculation, $V_{KG}$ is $-117$ V and the measured gate voltage is $-100$ V $\sim 150$ V. The circuit is believed to be operated according to the specification of the design.

When the semiconductor device of the Darlington transistor was used in the switching of the inductance load (ignition coil) of an igniter, no variation in the breakdown voltage $BV_{AK}$ was observed in a machine run for 10000 hours at a high temperature.

In the diode of the semiconductor circuit device using a p-type substrate, a maximum negative potential is obtained with respect to the substrate 11 and, in order to reverse bias the gate electrode with respect to the substrate 11, it is necessary to apply an external potential.

Figure 7:
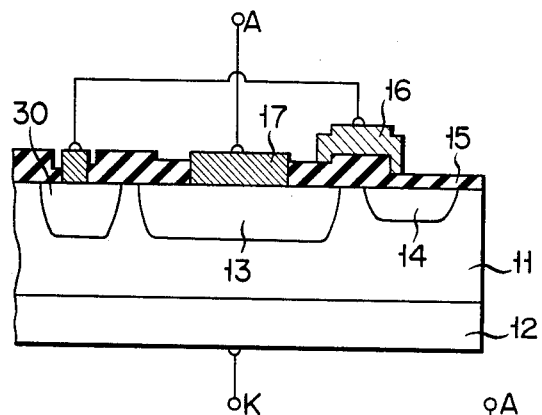
FIGS. 7 to 10 are cross-sectional views showing protection diode sections for explaining the second to fifth, respectively embodiments of this invention.

Various means are known for applying $V_{KG}$ as a proper potential. For example, a means for utilizing a guard ring junction potential as shown in FIG. 7 is used as such a means. That is, a field limiting region 30 is, together with an anode region 13, formed in the major surface of a semiconductor substrate 11 such that it surrounds the diode region including the regions 13 and 14. The control from $V_{KG}$ is performed according to the distance of a main junction.

Figure 8:
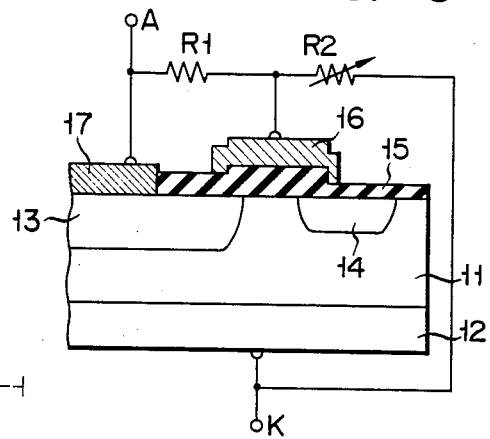
Figure 9:
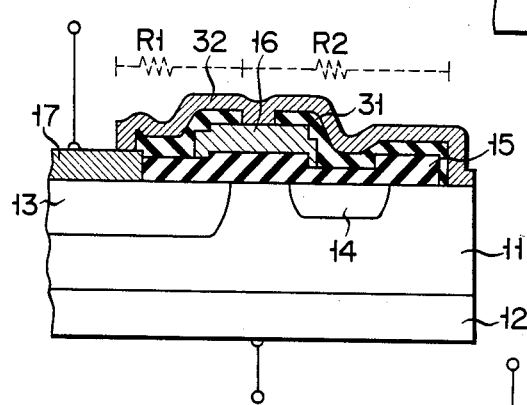

In the embodiment shown in FIG. 8, a gate electrode 16 is externally connected to, and a gate potential is set at a level corresponding to a potential on a junction between the external resistors R1 and R2. If, in this case, an electromotive force is utilized instead of these resistors, a diode involving no variation in breakdown voltage can be effectively constructed even in the case of a p-type substrate 11. Such external resistors R1 and R2 can be formed integrally with a semiconductor circuit device as shown in FIG. 9. That is, an insulating film 31 is formed on the external surface portion of a gate electrode 16 and a high specific resistance film 32, such as SIPOS, is formed on the insulating film 31. The gate electrode 16 is connected to an anode electrode and collector substrate 11.

Figure 10:
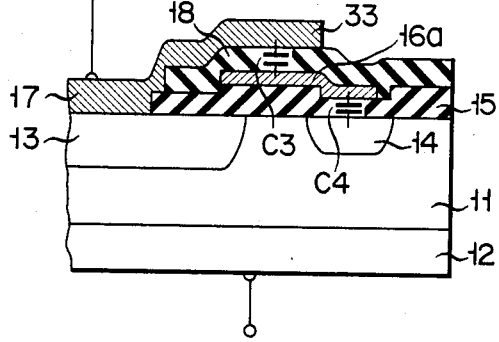

In the embodiment shown in FIG. 10, a gate electrode 16a is formed of a doped polysilicon or molybdenum. A second gate electrode 33 is overlappingly formed above a gate electrode 16a with an insulating protection film 18 therebetween. A gate potential is provided by a capacitance C3 between the gate electrodes 16a and 33 and a capacitance C4 between the gate electrode 16a and a cathode (high concentration) region 14.

What is claimed is:
1. A semiconductor circuit device including an overvoltage semiconductor element, comprising:
   (a) a semiconductor substrate of a first conductivity type, which type is from the group comprising p-type and N-type;
   (b) a first region formed in a major surface of said semiconductor substrate and being of a second conductivity type from the group comprising p-type and N-type, and being a different type from the first conductivity type;
   (c) a second region formed in said major surface of said semiconductor substrate, so that said second region is spaced apart from said first region and being of said first conductivity type, and having a higher impurity concentration than said semiconductor substrate;
   (d) an insulating film formed on said semiconductor substrate between said first and second regions and on at least part of each of said first and second regions;
   (e) a gate electrode formed on said insulating film in such a way that said gate electrode lies above a region of said semiconductor substrate which is located between said first and second regions, and partially extends over said first and second regions; and
   (f) gate potential setting means for applying a gate voltage to said gate electrode, said gate voltage being high enough to produce an inversion channel of said second conductivity type at the surface region of said semiconductor substrate between said first and second regions, and setting the electric field strength between said gate electrode and the underlying portion of said semiconductor substrate at $-8 \sim -2 \times 10^5$ V/cm when a breakdown occurs between said first and second regions.

2. A semiconductor circuit device including an overvoltage protection element, comprising:
   (a) a semiconductor substrate having a first conductivity type;
   (b) a first region formed in a major surface of said semiconductor substrate and being of a second conductivity type, different from said first conductivity type;
   (c) a second region formed in the major surface of said semiconductor substrate, so that said second region is spaced apart from said first region and is of said first conductivity type, and has a higher impurity concentration than said semiconductor substrate;
   (d) an insulating film formed on said semiconductor substrate between said first and second regions and on at least part of each of said first and second regions;
   (e) a gate electrode formed on said insulating film in such a way that said gate electrode lies above that region of said semiconductor substrate which is located between said first and second regions, and partially extends over said first region at a first overlapped region, and over said second region at a second overlapped region, said gate electrode being electrically floated;
   (f) gate potential setting means having voltage dividing means including a first capacitance formed in said first overlapped region and a second capacitance formed in said second overlapped region for dividing the voltage applied between said first and second regions so that a voltage is applied as a gate voltage to that portion of said insulating film which is located between said gate electrode and said semiconductor substrate between said first and second regions, said gate potential setting means for applying an electric field having an intensity of $-8 \times 10^5$ to $-2 \times 10^5$ V/cm to said insulating film and for applying a gate voltage to said gate electrode to form an inversion layer of said second conductivity type in the surface of said portion of said substrate which extends between said first and second regions.

3. A semiconductor circuit device including an overvoltage protection element, comprising:

(a) a semiconductor substrate having a first conductivity type;

(b) a base region formed in a major surface of said semiconductor substrate and being of a second conductivity type different from said first conductivity type;

(c) an emitter region formed in said base region and being of said first conductivity type;

(d) a first region formed in the surface of said semiconductor substrate surrounding said base region and being of said second conductivity type, said first region and said base region being simultaneously formed, said first region having a periphery;

(e) a second region formed in the surface of said semiconductor substrate at the periphery of said first region so as to surround said first region, and being of the first conductivity type, said second region and said emitter region being simultaneously formed;

(f) an insulating film formed on said semiconductor substrate between said first and second regions and on at least part of each of said first and second regions;

(g) a gate electrode formed on said insulating film in such a way that said gate electrode lies above that region of said semiconductor substrate which is located between said first and second regions, and partially extends over said first region at a first overlapped region, and said second region at a second overlapped region, said gate electrode being electrically floated;

(h) gate potential setting means having voltage dividing means including a first capacitor formed in the first overlapped region and a second capacitor formed in the second overlapped region for dividing the voltage applied between said first and second regions so that a voltage is applied as a gate voltage to that portion of said insulating film which is located between said gate electrode and said semiconductor substrate between said first and second regions, said gate potential setting means for applying an electric field having an intensity of $-8 \times 10^5$ to $-2 \times 10^5$ V/cm to said insulating film and for applying a gate voltage to said gate electrode to form an inversion layer of said second conductivity type in the surface of said portion of said substrate which extends between said first and second regions.

* * * * *

UNITED STATES PATENT AND TRADEMARK OFFICE
CERTIFICATE OF CORRECTION

PATENT NO. : 4,672,402

DATED : June 9, 1987

INVENTOR(S) : YAMAOKA et al.

It is certified that error appears in the above-identified patent and that said Letters Patent is hereby corrected as shown below:

On the Title Page

Related U.S. Application Data should read --

[63] Continuation of Ser. No. 594,016, Mar. 27, 1984, abandoned. --

Signed and Sealed this

Tenth Day of October, 1989

Attest:

DONALD J. QUIGG

*Attesting Officer*      *Commissioner of Patents and Trademarks*